(12) United States Patent
Vimercati et al.

(10) Patent No.: US 10,410,709 B2
(45) Date of Patent: *Sep. 10, 2019

(54) TECHNIQUES FOR SENSING LOGIC VALUES STORED IN MEMORY CELLS USING SENSE AMPLIFIERS THAT ARE SELECTIVELY ISOLATED FROM DIGIT LINES

(71) Applicant: Micron Technology, Inc., Boise, ID (US)

(72) Inventors: Daniele Vimercati, El Dorado Hills, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,152

(22) Filed: Dec. 27, 2017

(65) Prior Publication Data

US 2018/0137906 A1    May 17, 2018

Related U.S. Application Data

(63) Continuation of application No. 15/282,029, filed on Sep. 30, 2016, now Pat. No. 9,886,991.

(51) Int. Cl.
*G11C 11/22* (2006.01)
*G11C 7/10* (2006.01)

(52) U.S. Cl.
CPC ........ *G11C 11/2273* (2013.01); *G11C 7/1051* (2013.01); *G11C 7/1072* (2013.01); *G11C 11/2275* (2013.01); *G11C 11/2293* (2013.01)

(58) Field of Classification Search
CPC ............ G11C 11/2273; G11C 11/2275; G11C 11/2293; G11C 11/4091; G11C 7/1072; G11C 7/1051; G11C 7/062; G11C 7/065; G11C 7/1048
See application file for complete search history.

(56) References Cited

U.S. PATENT DOCUMENTS

| | | | |
|---|---|---|---|
| 6,031,754 | A | 2/2000 | Derbenwick et al. |
| 6,347,059 | B2 | 2/2002 | Bohm et al. |
| 6,721,217 | B2 | 4/2004 | Madan et al. |
| 8,477,522 | B2 | 7/2013 | Clinton et al. |

(Continued)

*Primary Examiner* — Harry W Byrne
*Assistant Examiner* — Sultana Begum
(74) *Attorney, Agent, or Firm* — Holland & Hart LLP

(57) ABSTRACT

Methods, systems, and devices for operating an electronic memory apparatus are described. A logic value stored in a ferroelectric random access memory (FeRAM) cell is read onto a first sensing node of a sense amplifier. The reading is performed through a digit line coupling the FeRAM cell to the first sensing node, while the sense amplifier is in an inactive state. A second sensing node of the sense amplifier is biased to a reference voltage provided by a reference voltage source. The biasing is performed while reading the logic value stored in the FeRAM cell onto the first sensing node. The digit line is isolated from the first sensing node after the reading. The sense amplifier is activated, after isolating the digit line from the first sensing node, to amplify and sense a voltage difference between the first sensing node and the second sensing node.

20 Claims, 8 Drawing Sheets

(56) References Cited

U.S. PATENT DOCUMENTS

| | | | |
|---|---|---|---|
| 2003/0058686 A1* | 3/2003 | Ooishi | G11C 11/16 365/171 |
| 2006/0034142 A1* | 2/2006 | Ooishi | G11C 8/10 365/230.06 |
| 2010/0329019 A1 | 12/2010 | Mukunoki | |

* cited by examiner

TECHNIQUES FOR SENSING LOGIC VALUES STORED IN MEMORY CELLS USING SENSE AMPLIFIERS THAT ARE SELECTIVELY ISOLATED FROM DIGIT LINES

CROSS REFERENCE

The present application for patent is a continuation of U.S. patent application Ser. No. 15/282,029 by Vimercati et al., entitled "Techniques For Sensing Logic Values Stored In Memory Cells Using Sense Amplifiers That Are Selectively Isolated From Digit Lines," filed Sep. 30, 2016, assigned to the assignee hereof, and is expressly incorporated by reference in its entirety herein.

BACKGROUND

The following relates generally to electronic memory apparatuses, and more specifically to techniques for sensing logic values stored in memory cells using sense amplifiers that are selectively isolated from digit lines.

Electronic memory apparatuses are widely used to store information in various electronic devices such as computers, wireless communication devices, cameras, digital displays, and the like. Information is stored by programming different states into the electronic memory apparatus. For example, binary electronic memory apparatuses have two states, often denoted by a logic "1" and a logic "0." In other systems, more than two states may be stored. To access the stored information, a device may read, or sense, the stored state in the electronic memory apparatus. To store information, the device may write, or set, the state in the electronic memory apparatus.

Various types of electronic memory apparatuses exist, such as random access memory (RAM), read only memory (ROM), dynamic RAM (DRAM), synchronous dynamic RAM (SDRAM), ferroelectric RAM (FeRAM), magnetic RAM (MRAM), resistive RAM (ReRAM), flash memory, and others. Electronic memory apparatuses may be volatile or non-volatile. Non-volatile electronic memory apparatuses, e.g., flash memory, can store data for extended periods of time even in the absence of an external power source. Volatile electronic memory apparatuses, e.g., DRAM, may lose their stored state over time unless they are periodically refreshed by an external power source. A binary electronic memory apparatus may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile memory may offer performance advantages such as the ability to store data without periodic refreshing (which may reduce power consumption).

FeRAM may use similar device architectures similar to those of volatile memory, but may have non-volatile properties due to the use of a ferroelectric capacitor as a storage device. FeRAM devices may thus have improved performance compared to other non-volatile and volatile electronic memory apparatuses. FeRAM performance may be further improved by increasing the speed at which data is read from the capacitors used in an FeRAM array.

BRIEF DESCRIPTION OF THE DRAWINGS

Aspects of the disclosure are described with reference to the following figures.

DETAILED DESCRIPTION

Figure 1:
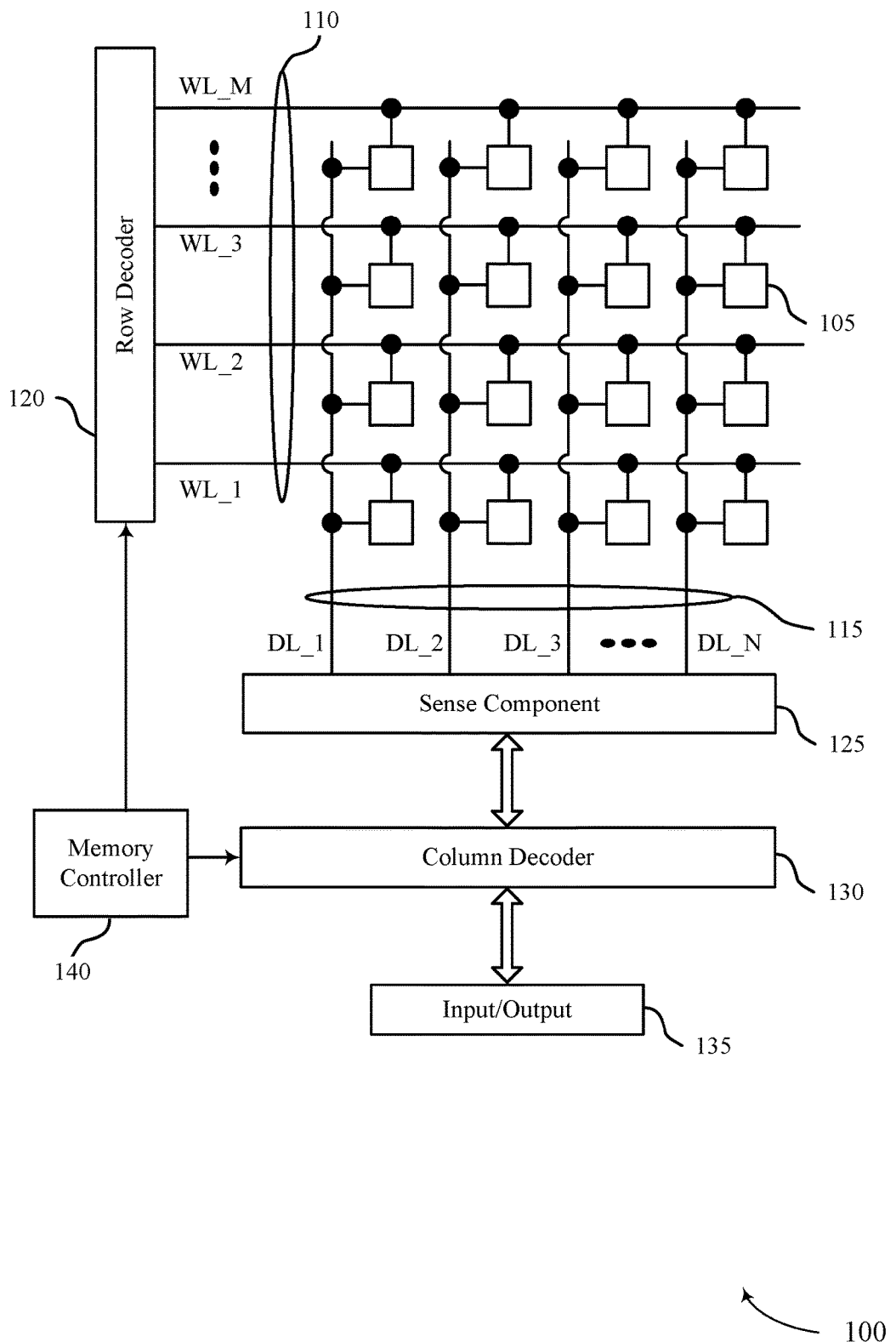
FIG. 1 illustrates an example electronic memory apparatus, in accordance with various aspects of the present disclosure.

Memory cells with a memory array, including FeRAM cells within a memory array, may be accessed by applying voltages to a word line and a digit line. Access of a memory cell may include writing the memory cell (e.g., storing a logic state or value) or reading the memory cell (e.g., reading a stored logic state or value). Each FeRAM cell may have a ferroelectric capacitor, or other storage component, that is used to store a logic value of the memory cell. A single digit line may connect multiple memory cells and may be connected to a sense amplifier that, when activated during a read operation, may be used to determine the stored logic state of a memory cell. For example, an activated sense amplifier may compare a logic state (e.g., a voltage) extracted from a memory cell to a reference signal.

When performing a sense operation (e.g., comparing a voltage representative of a logic value to a reference voltage), a sense amplifier is typically coupled to a digit line onto which the voltage representing the logic value is read, and performing the sense operation may result in "kick back" noise propagating down the digit line and into the storage portion of a memory array. This can have undesirable effects and may influence the design of a memory array. Also when performing the sense operation, the sense amplifier may use a voltage on a digit line coupled to a non-addressed memory cell as the reference voltage to which a voltage representing a logic value is compared. Again, this may result in kick back noise propagating down the digit line and into the storage portion of a memory array. Leaving digit lines coupled to a sense amplifier during a sense operation can also increase power consumption compared to performing the sense operation with digit lines decoupled from the sense amplifier.

In one example of techniques described herein, a logic value stored in a FeRAM cell may be read onto a first sensing node of a sense amplifier. The reading may be performed through a digit line coupling the FeRAM cell to the first sensing node, while the sense amplifier is in an inactive state. A second sensing node of the sense amplifier may be biased to a reference voltage provided by a reference voltage source. The reference voltage may be provided by a constant reference voltage source and need not be provided over a digit line coupled to a non-addressed memory cell. The biasing may be performed while reading the logic value stored in the FeRAM cell onto the first sensing node. The digit line may be isolated from the first sensing node after the reading. The sense amplifier may be activated, after isolating the digit line from the first sensing node, to amplify and sense a voltage difference between the first sensing node and the second sensing node.

Aspects of the disclosure introduced above are further described below in the context of an electronic memory apparatus. Specific examples are then described. These and other aspects of the disclosure are further illustrated by and described with reference to apparatus diagrams, system diagrams, and flowcharts.

FIG. 1 illustrates an example electronic memory apparatus 100, in accordance with various aspects of the present disclosure. The electronic memory apparatus 100 may include a plurality of memory cells 105 that are programmable to store different states. In some examples, each memory cell 105 may be programmable to store two logic states, denoted a logic "0" and a logic "1". In other examples, a memory cell 105 may be configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a FeRAM cell may include a capacitor that has a ferroelectric material as the dielectric material. Ferroelectric materials have non-linear polarization properties.

Operations such as reading and writing may be performed on the memory cells 105 by activating or selecting an appropriate word line 110 and digit line 115. In some cases, a word line 110 may be referred to as an access line, and a digit line 115 may be referred to as a bit line. Activating or selecting a word line 110 or a digit line 115 may include applying a voltage potential (e.g., a high level voltage or a low level voltage) to the respective line. The word lines 110 and digit lines 115 may be made of conductive materials. For example, the word lines 110 and digit lines 115 are made of metals (e.g., copper, aluminum, gold, tungsten, etc.), metal alloys, other conductive materials, or the like. Each row of memory cells 105 may be connected to a single word line 110, and each column of memory cells 105 may be connected to a single digit line 115. By activating or selecting one word line 110 and one digit line 115, a single memory cell 105 coupled to the word line 110 and digit line 115 may be accessed. Identifiers of the word line 110 and digit line 115 associated with a memory cell 105 may be referred to as an address of the memory cell 105 (though in some cases, an address of a memory cell 105 may further include one or more of a memory block identifier, a memory bank identifier, etc.).

In some architectures, the logic storing device of a memory cell 105, e.g., a capacitor, may be electrically isolated from a digit line 115 associated with the memory cell 105 by a selection component. The word line 110 associated with the memory cell 105 may be connected to and may control the selection component. In some examples, the selection component may include a transistor, and the word line 110 may be connected to the gate of the transistor. Activating the word line 110 may result in an electrical connection between one electrode of the capacitor of the memory cell 105 and the digit line 115 associated with the memory cell. The digit line 115 may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate or select the appropriate digit line 115. Thus, by activating or selecting a word line 110 and a digit line 115, a memory cell 105 may be accessed. For example, the electronic memory apparatus 100 may include multiple word lines 110, labeled WL_1 through WL_M, and multiple digit lines 115, labeled DL_1 through DL_N, where M and N depend on a memory array size. By activating a word line 110 and a digit line 115, e.g., WL_2 and DL_3, the memory cell 105 coupled to the word line 110 (e.g., WL_2) and digit line 115 (e.g., DL_3) may be accessed. In some examples, all of the memory cells 105 associated with a word line 110 may be accessed by activating or selecting all of the digit lines 115 associated with the memory cells 105.

A memory cell 105 may be read, or sensed, by a sense component 125 to determine the logic state stored in the memory cell 105. For example, after accessing (e.g., addressing) a FeRAM cell, a ferroelectric capacitor of the FeRAM cell may discharge onto a corresponding digit line 115. Discharging the ferroelectric capacitor may be based on biasing, or applying a voltage to, the ferroelectric capacitor. The discharging may induce a change in the voltage of the digit line 115, which the sense component 125 may compare to a reference voltage (not shown) in order to determine the logic state stored in the FeRAM cell. For example, when a voltage of the digit line 115 is higher than the reference voltage, the sense component 125 may determine that the logic state stored in the FeRAM cell is a logic "1," and when a voltage of the digit line 115 is lower than the reference voltage, the sense component 125 may determine that the logic state stored in the FeRAM cell is a logic "0." In some examples, the sense component 125 may include various transistors or amplifiers (e.g., sense amplifiers) used to amplify and sense a voltage differences between one or more of the digit lines 115 and a reference voltage. In some examples, the sense component 125 may latch the voltage difference(s). The sensed logic state of one or more memory cells 105 may then be output through the column decoder 130 as output 135.

A memory cell 105 may be written, or set, by similarly accessing (e.g., addressing) the memory cell and applying a voltage or voltages representative of a particular logic to the electrodes of a capacitor of the memory cell. As discussed above, activating a word line 110 electrically connects a corresponding row of memory cells 105 to their associated digit lines 115. By controlling the voltage of one or more of the digit lines 115 while the word line 110 is activated, one or more of the memory cells 105 may be written—i.e., a logic value may be stored in the memory cell 105. In some examples (e.g., in the case of a FeRAM cell), a cell plate voltage applied to the ferroelectric capacitor of the memory cell 105 may also need to be controlled. In some example, the column decoder 130 may accept data, for example input 135, to be written to the memory cells 105.

In some memory architectures, accessing a memory cell 105 may degrade or destroy the logic state stored in the memory cell 105, and a re-write or refresh operation may be performed to re-write the logic state to the memory cell 105. In a DRAM, for example, the capacitor may be partially or completely discharged during a sense operation, corrupting the stored logic state. The logic state may therefore be re-written after a sense operation. Additionally, activating a single word line 110 may result in the discharge of all memory cells in the row; thus, all memory cells 105 in the row may need to be read and re-written.

Some memory architectures, including DRAM architectures, may lose their stored state over time unless they are periodically refreshed by an external power source. For example, a charged capacitor may become discharged over time through leakage currents, resulting in the loss of a stored logic state. The refresh rate of these so-called volatile electronic memory apparatuses may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, FeRAM cells may have beneficial properties that may result in improved performance relative to other memory architectures.

The memory controller 140 may control the operation (read, write, re-write, refresh, etc.) of the memory cells 105 through the various components, for example, row decoder 120, column decoder 130, and sense component 125. The memory controller 140 may generate row and column address signals in order to activate a desired word line 110 and digit line(s) 115. The memory controller 140 may also generate and control various voltage potentials used during the operation of the electronic memory apparatus 100. For example, the memory controller 140 may control cell plate voltages of the memory cells 105. In general, the amplitude, shape, or duration of an applied voltage described herein may be adjusted or varied and may be different for the various operations employed in operating the electronic memory apparatus 100. Furthermore, one, multiple, or all of the memory cells 105 in the electronic memory apparatus 100 may be accessed simultaneously; for example, multiple or all memory cells 105 of the electronic memory apparatus 100 may be accessed simultaneously during a reset operation, in which all of the memory cells 105, or a group of the memory cells 105, are set to a single logic state.

Figure 2:
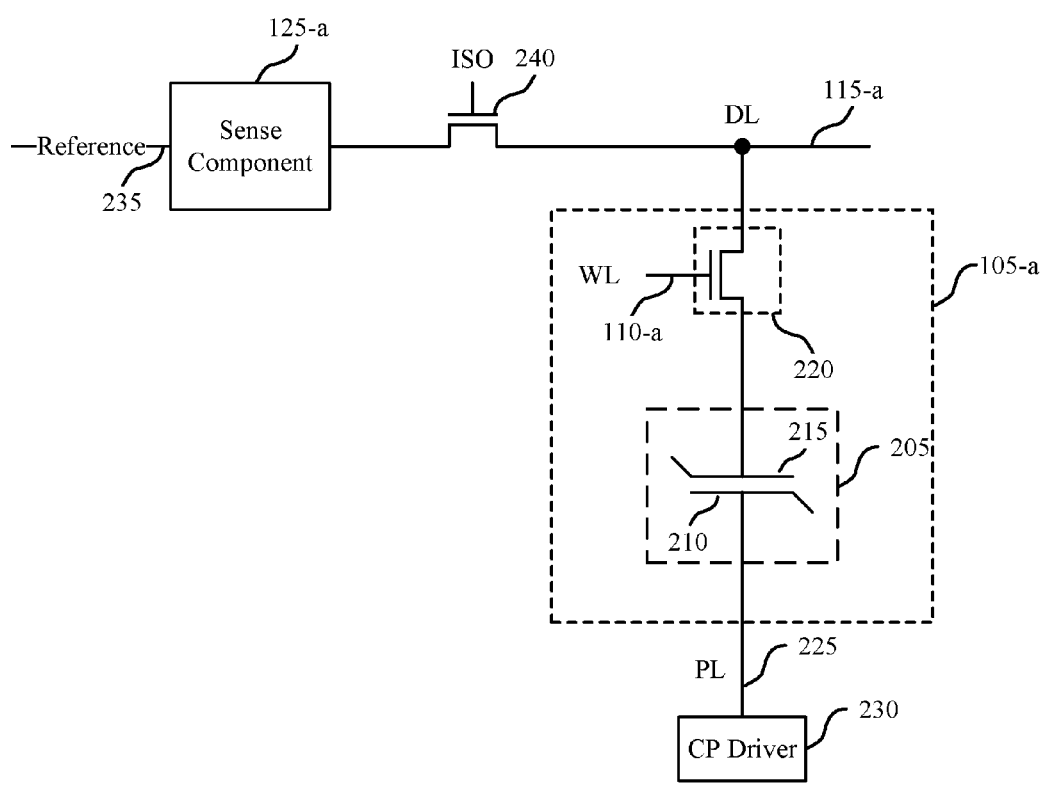
FIG. 2 illustrates an example electronic memory apparatus, in accordance with various aspects of the present disclosure.

FIG. 2 illustrates an example electronic memory apparatus 200, in accordance with various aspects of the present disclosure. The electronic memory apparatus 200 may include a memory cell (e.g., a FeRAM cell 105-*a*) associated with a word line (WL) 110-*a*, a digit line (DL) 115-*a*, and a sense component 125-*a*, which may be examples of the memory cell 105, word line 110, digit line 115, and sense component 125, respectively, described with reference to FIG. 1. The FeRAM cell 105-*a* may include a logic storage component, such as ferroelectric capacitor 205 having two conductive electrodes, a cell plate electrode (PL) 210 and a storage node electrode (SN) 215. The electrodes may be separated by an insulating ferroelectric material. As described above, various states may be stored by charging or discharging the ferroelectric capacitor 205 The FeRAM cell 105-*a* may also include a selection component 220 coupling the storage node electrode 215 of the ferroelectric capacitor 205 to the digit line 115-*a*. A plate line (PL) 225 may be coupled to the cell plate electrode 210 of the ferroelectric capacitor 205. In this manner, the ferroelectric capacitor 205 may be accessed, controlled, read, or written by means of the voltages applied to the digit line 115-*a* and the plate line 225.

The stored state of the ferroelectric capacitor 205 may be read or sensed by operating various elements of the electronic memory apparatus 200. The ferroelectric capacitor 205 may be isolated from the digit line 115-*a* when the selection component 220 is deactivated (e.g., when the word line 110-*a* is not asserted), and the ferroelectric capacitor 205 may be coupled to the digit line 115-*a*, via the selection component 220, when the selection component 220 is activated (e.g., when the word line 110-*a* is asserted). In some cases, the selection component 220 may include a transistor (e.g., an NMOS transistor) having a source coupled to the storage node electrode 215 of the ferroelectric capacitor 205, a drain coupled to the digit line 115-*a*, and a gate driven by the word line 110-*a*. In an alternative embodiment, the positions of the selection component 220 and the ferroelectric capacitor 205 may be switched, such that the selection component 220 is coupled to and between the plate line 225 and the cell plate electrode 210, and such that the ferroelectric capacitor 205 is coupled to and between the digit line 115-*a* and the selection component 220. This configuration may be associated with alternative timing and biasing for read and write operations.

Due to the ferroelectric material between the electrodes of the ferroelectric capacitor 205, and as discussed in more detail below, the ferroelectric capacitor 205 may not discharge upon connection to the digit line 115-*a*. In one scheme, to sense the logic state stored by the ferroelectric capacitor 205, the word line 110-*a* may be asserted to select the FeRAM cell 105-*a* and a voltage may be applied (e.g., by a cell plate (CP) driver 230) to the plate line 225. In some cases, the digit line 115-*a* may be virtually grounded and then isolated from the virtual ground (i.e., "floating") prior to asserting the word line 110-*a* and biasing the plate line 225. Biasing the plate line 225 may result in a voltage difference (e.g., plate line voltage minus digit line voltage) across the ferroelectric capacitor 205. The voltage difference may yield a change in the stored charge on the ferroelectric capacitor 205, where the magnitude of the change in the stored charge may depend on the initial logic state of the ferroelectric capacitor 205—e.g., whether the initial logic state is a logic "1" or a logic "0." This may induce a change in the voltage of the digit line 115-*a* based on the charge stored on ferroelectric capacitor 205. Operation of the FeRAM cell 105-*a* by varying the voltage applied to the plate line 225 may be referred to as "moving cell plate" operation.

In an alternative operation of the FeRAM cell 105-*a*, a fixed or constant voltage may be applied to the plate line 225 (e.g., the fixed voltage may be half of the voltage supplied to sense component 125-*a*). That is, the voltage applied to plate line 225 may remain at a fixed voltage and may not be varied as described above. This operation may be referred to as "fixed cell plate" operation. In order to read the FeRAM cell 105-*a* using fixed cell plate operation, the digit line 115-*a* may be virtually grounded, and subsequently isolated from the virtual ground, prior to asserting the word line 110-*a*. As described above, selecting the FeRAM cell 105-*a* may result in a voltage difference across the ferroelectric capacitor 205, since plate line 225 is held at a finite voltage and the digit line 115-*a* was virtually grounded. As a result, the voltage of the digit line 115-*a* may change, e.g., become some finite value.

Regardless of whether the FeRAM cell 105-*a* is read according to "moving cell plate" operation, "fixed cell plate" operation, or some other method of operation, the change in the voltage of the digit line 115-*a* may depend on the intrinsic capacitance of the digit line 115-*a*—i.e., as charge flows through the digit line 115-*a*, some finite charge may be stored in digit line 115-*a* and the resulting voltage of the digit line 115-*a* may depend on the intrinsic capacitance. The intrinsic capacitance may depend on physical characteristics, including the dimensions, of the digit line 115-*a*. The digit line 115-*a* may connect FeRAM cells 105 to the digit line 115-*a*, so the digit line 115-*a* may have a length that results in a non-negligible capacitance (e.g., on the order of picofarads (pF)). The resulting voltage of the digit line 115-*a* may then be compared to a reference (e.g., a voltage of reference line 235), by the sense component 125-*a*, in order to determine the stored logic state in memory cell 105-*a*.

The sense component 125-*a* may include various transistors or amplifiers (e.g., a sense amplifier) to amplify and sense a voltage difference between the voltage of the digit line 115-*a* and a voltage of the reference line 235. In some examples, the sense component 125-*a* may latch the voltage difference. In some examples, an output of the sense component 125-*a* may be driven to a high (e.g., a positive) supply voltage or to a low (e.g., a negative or ground) supply voltage based on the comparison. For instance, when the digit line 115-*a* has a higher voltage than the reference line 235, the sense component 125-*a* output may be driven to a positive supply voltage. In some cases, the sense component 125-*a* may drive the digit line 115-*a* to the positive supply voltage while performing a sensing operation. In other cases, the digit line 115-*a* may be decoupled from the sense component 125-*a* by a transfer gate 240 prior to performance of the sensing operation. Alternatively, when the digit line 115-*a* has a lower voltage than the reference signal 235, the sense component 125-*a* output may be driven to a negative or ground supply voltage. In some cases, the sense component 125-*a* may drive the digit line 115-*a* to the negative or ground supply voltage while performing a sensing operation. In other cases, the digit line 115-*a* may be decoupled from the sense component 125-*a* by a transfer gate 240 prior to performance of the sensing operation. The transfer gate 240 may include a transistor (e.g., an NMOS transistor) having a source coupled to the sense component 125-*a*, a drain coupled to the digit line 115-*a*, and a gate driven by an isolation signal (ISO).

To write the FeRAM cell 105-*a* according to moving cell plate operation, a voltage associated with a logic state may be applied across the ferroelectric capacitor 205. Various methods may be used to apply the voltage. In one example, the selection component 220 may by asserting the word line 110-*a* in order to electrically connect the ferroelectric capacitor 205 to the digit line 115-*a*. A voltage may be applied across the ferroelectric capacitor 205 by controlling the voltage of the cell plate electrode 210 (through the plate line 225) and the storage node electrode 215 (through the digit line 115-*a*). To write a logic "0," the cell plate driver 230 may apply a high voltage (e.g., a positive voltage) to the cell plate electrode 210 through the plate line 225, and a low voltage (e.g., a negative or ground voltage) may be applied to the storage node electrode 215 through the digit line 115-*a*. The opposite voltages may be applied to the electrodes of the ferroelectric capacitor 205 to write a logic 1 (e.g., the cell plate electrode 210 may be taken low and the storage node electrode 215 may be taken high.

With regards to fixed cell plate operation, writing the FeRAM cell 105-*a* may include activating the selection component 220 and biasing the storage node electrode 215 through the digit line 115-*a*. In some cases, the fixed voltage magnitude of the cell plate electrode 210 may be a value between the supply voltages of the sense component 125-*a*, and the sense component 125-*a* may be used to drive the voltage of the digit line 115-*a* to a voltage equal to the high or the low supply voltage. For instance, to write a logic "0,", the voltage of the digit line 115-*a* may be driven to the low supply voltage, to apply the low supply voltage to the storage node electrode 215; and to write a logic "1," the voltage of the digit line 115-*a* may be driven to the high supply voltage, to apply the high supply voltage to the storage node electrode 215.

Figure 3:
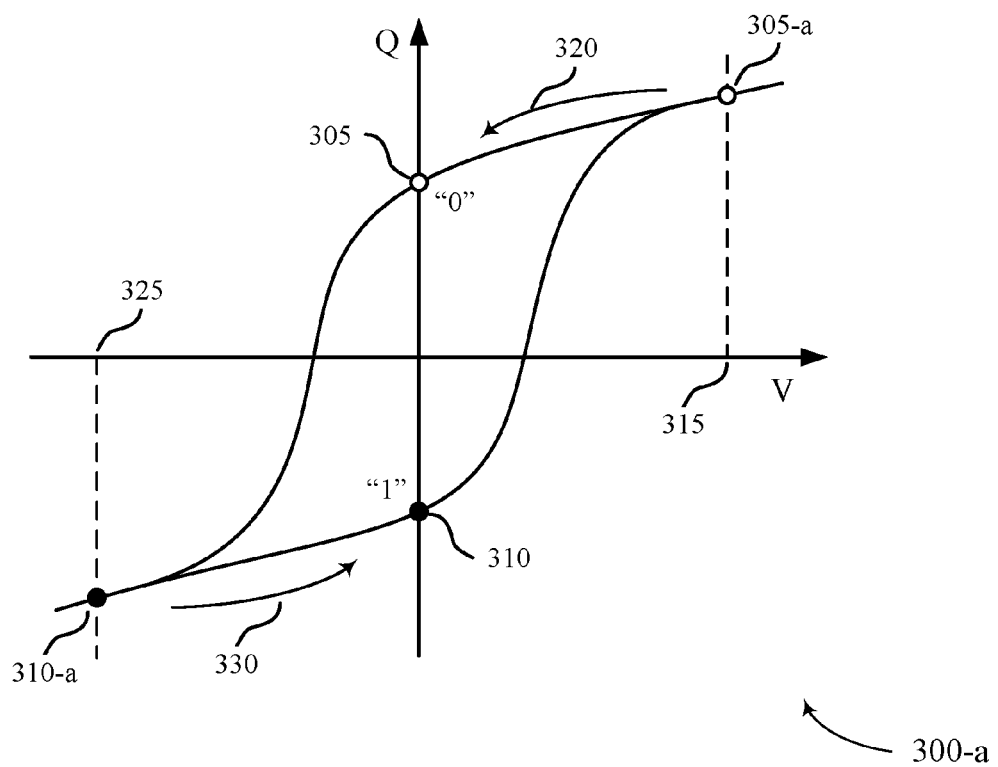
FIG. 3 illustrates examples of non-linear electrical properties of a FeRAM cell, in accordance with various aspects of the present disclosure.
Figure 3:
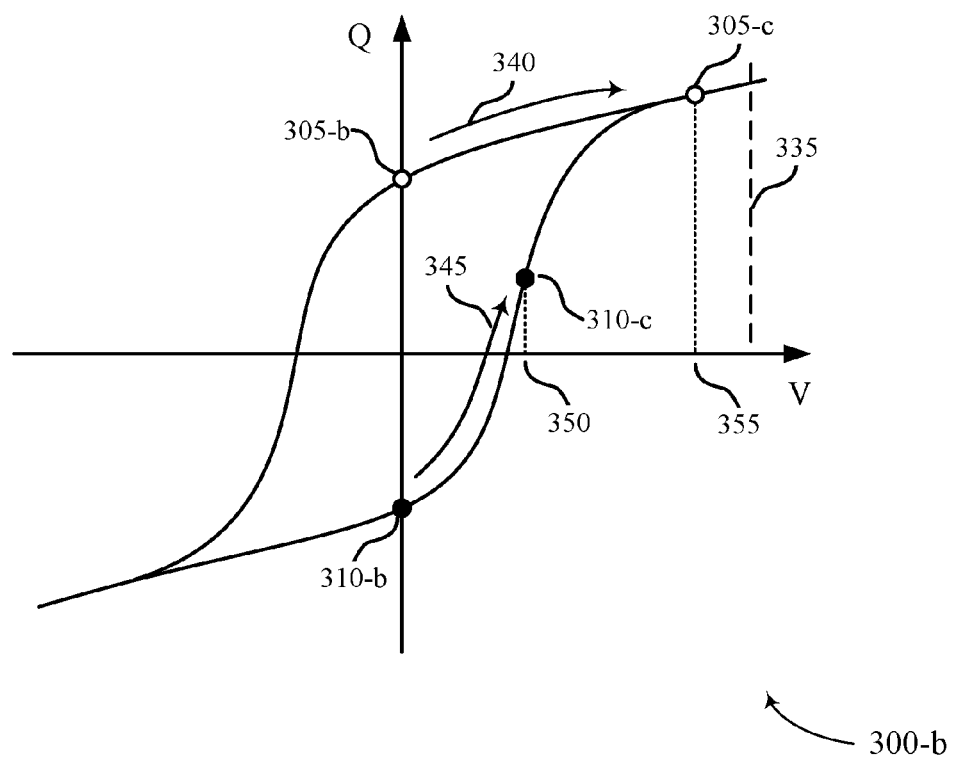

FIG. 3 illustrates examples of non-linear electrical properties of a FeRAM cell, in accordance with various aspects of the present disclosure. A first hysteresis curve 300-*a* illustrates non-linear electrical properties of the FeRAM cell during a write of the FeRAM cell, and a second hysteresis curve 300-*b* illustrates non-linear electrical properties of the FeRAM cell during a read of the FeRAM cell. Each of the hysteresis curves 300 depict the charge, Q, stored on a ferroelectric capacitor of the FeRAM cell as a function of a voltage difference, V. The FeRAM cell may be an example of aspects of the memory cell 105 or FeRAM cell 105-*a* described with reference to FIG. 1 or 2, and the ferroelectric capacitor may be an example of the ferroelectric capacitor 205 described with reference to FIG. 2.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor's electrodes. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single electrode of a capacitor. By way of example, if the ferroelectric material has a negative polarization, positive charge accumulates at the electrode. Likewise, if the ferroelectric material has a positive polarization, negative charge accumulates at the electrode. Additionally, it should be understood that the voltage differences in the hysteresis curves 300 represent voltage differences across a ferroelectric capacitor and are directional. For example, a positive voltage may be realized by applying a positive voltage to the electrode in question (e.g., the cell plate electrode 210 described with reference to FIG. 2) and maintaining the second electrode (e.g., the storage node electrode 215 described with reference to FIG. 2) at ground (or approximately zero volts (0V)). A negative voltage may be applied by maintaining the electrode in question at ground and applying a positive voltage to the second electrode—i.e., positive voltages may be applied to negatively polarize the electrode in question. Similarly, two positive voltages, two negative voltages, or any combination of positive and negative voltages may be applied to the appropriate capacitor electrodes to generate the voltage differences shown in the hysteresis curves 300.

As depicted in the first hysteresis curve 300-*a*, the ferroelectric material may maintain a positive or negative polarization with a zero voltage difference, resulting in two possible charged states: a charge state 305 and a charge state 310. According to the example of FIG. 3, the charge state 305 represents a high capacitive state or logic "0," and the charge state 310 represents a low capacitive state or logic "1." In some examples, the logic values of the respective charge states may be reversed to accommodate other schemes for operating a FeRAM cell.

A logic "0" or logic "1" may be written to the FeRAM cell by controlling the electric polarization of the ferroelectric material, and thus the charge on the ferroelectric capacitor electrodes, by applying a voltage across the ferroelectric capacitor. For example, applying a net positive voltage 315 across the ferroelectric capacitor results in charge accumulation until the charge state 305-a is reached. Upon removing the voltage 315, the charge follows path 320 until it reaches the charge state 305 at zero voltage potential. Similarly, the charge state 310 is written by applying a net negative voltage 325, which results in the charge state 310-a. After removing the negative voltage 325, the charge follows path 330 until it reaches the charge state 310 at zero voltage. The charge states 305-a and 310-a may be referred to as remnant polarization (Pr) values, i.e., the polarization (or charge) that remains upon removing the external bias (e.g., voltage). The coercive voltages are the voltages at which the charge (or polarization) is zero.

Turning to the second hysteresis curve 300-b, the stored state of the FeRAM cell may be read, or sensed, by applying a voltage across the ferroelectric capacitor. In response, the stored charge, Q, changes, and the degree of the change depends on the initial charge state—i.e., the final stored charge (Q) depends on whether the charge state 305-b or the charge state 310-b was initially stored. For example, the second hysteresis curve 300-b illustrates two possible stored charge states: the charge state 305-b and the charge state 310-b. A voltage 335 may be applied across the ferroelectric capacitor as discussed with reference to FIG. 2. In other cases, a fixed voltage may be applied to the cell plate electrode of the ferroelectric capacitor. Although depicted as a positive voltage, the voltage 335 may be negative. In response to application of the voltage 335, the charge may follow path 340. Likewise, if the charge state 310-b was initially stored, the charge may follow path 345. The voltages associated with the final charge states after following the path 340 or 345 (e.g., the charge state 305-c and the charge state 310-c) depend on a number of factors, including the sensing scheme and circuitry.

In some cases, a final charge state may depend on the intrinsic capacitance of the digit line connected to the FeRAM cell. For example, if the ferroelectric capacitor of the FeRAM cell is electrically connected to the digit line and the voltage 335 is applied, the voltage of the digit line may rise due to its intrinsic capacitance. So a voltage measured at a sense component may not equal the voltage 335 and instead may depend on the voltage of the digit line. The positions of the final charge states 305-c and 310-c on the second hysteresis curve 300-b may thus depend on the capacitance of the digit line and may be determined through a load-line analysis—i.e., the charge states 305-c and 310-c may be defined with respect to the capacitance of the digit line. As a result, the voltages across the ferroelectric capacitor at the charge state 305-c and the charge state 310-c (e.g., the voltage 350 and the voltage 355, respectively) may differ and may depend on the initial state of the ferroelectric capacitor.

By comparing the digit line voltage to a reference voltage, the initial state of the ferroelectric capacitor may be determined. The digit line voltage may be the difference between the voltage 335 and the final voltage across the capacitor—i.e., (voltage 335-voltage 350) or (voltage 335-voltage 355). A reference voltage may be generated such that its magnitude is between the two possible voltages of the two possible digit line voltages in order to determine the stored logic state i.e., if the digit line voltage is higher or lower than the reference voltage. For example, the reference voltage may be an average of the two quantities: (voltage 335-voltage 350) and (voltage 335-voltage 355). Upon comparison by the sense component, the sensed digit line voltage may be determined to be higher or lower than the reference voltage, and the stored logic value of the FeRAM cell (i.e., a logic "0" or a logic "1") may be determined.

As discussed above, reading a memory cell that does not use a ferroelectric capacitor may degrade or destroy the stored logic state. A FeRAM cell, however, may maintain the initial logic state after a read operation. For example, if charge state 305-b is stored, the charge may follow path 340 to the charge state 305-c during a read operation and, after removing the voltage 335, the charge may return to the initial charge state 305-b by following path 340 in the opposite direction.

Figure 4:
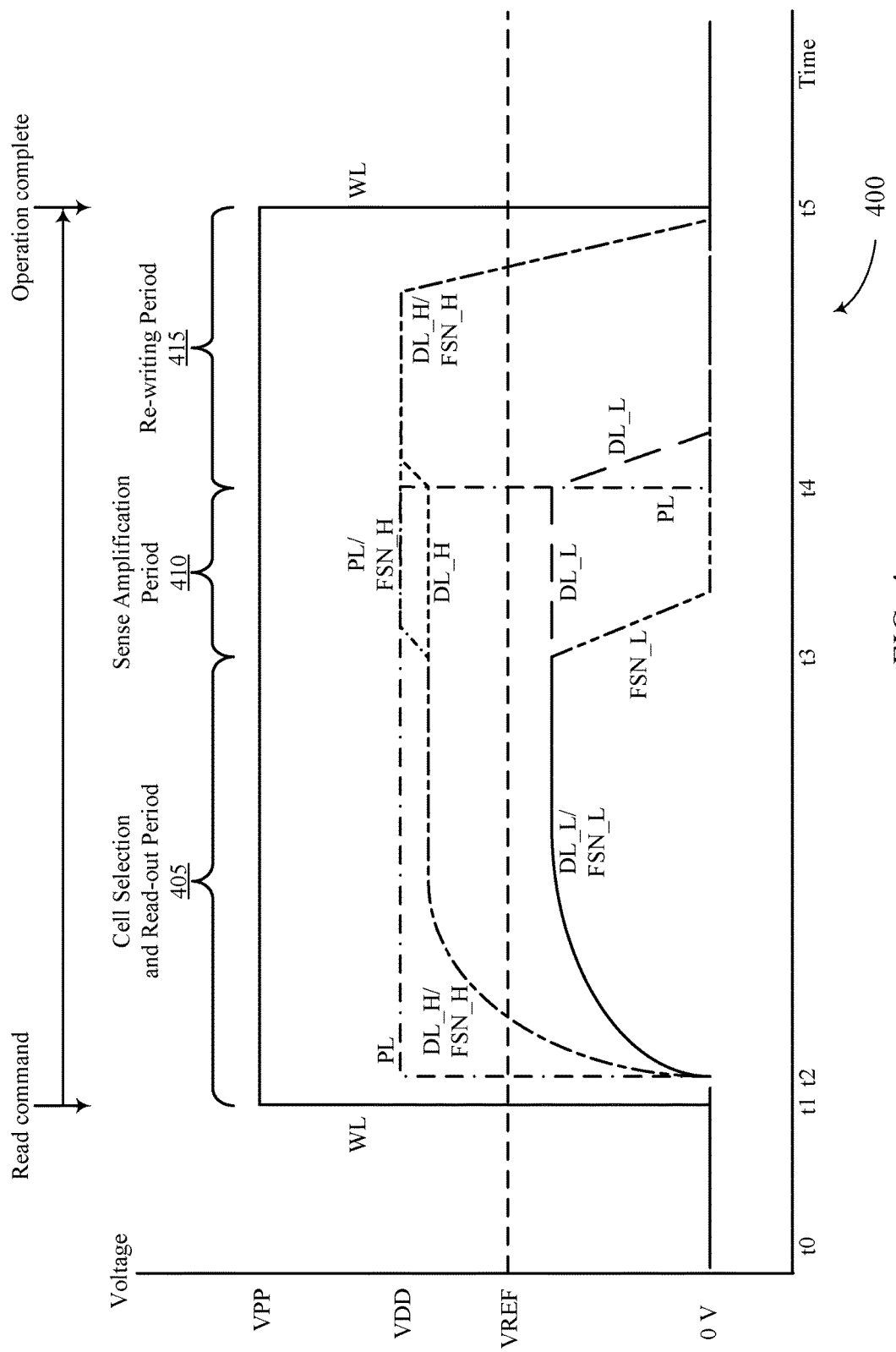
FIG. 4 is a graph of voltages that may be applied to a digit line (DL), a word line (WL), and a plate line (PL) of a FeRAM cell upon issuance of a memory read command, in accordance with various aspects of the present disclosure.

FIG. 4 is a graph 400 of voltages that may be applied to a digit line (DL), a word line (WL), and a plate line (PL) of a FeRAM cell upon issuance of a memory read command, in accordance with various aspects of the present disclosure. The graph 400 also shows voltages that may appear on the digit line and a first sensing node as a logic value stored in the FeRAM cell is read onto the digit line and sensed by a sense component. The FeRAM cell, sense component, digit line, the word line, and the plate line may be examples of aspects of the FeRAM cell 105-a, sense component 125-a, digit line 115-a, the word line 110-a, and the plate line 225 described with reference to FIG. 2.

At a time t0, the voltages of the digit line, the word line, and the plate line may all be equal, and in some cases may be held at low level voltage, such as 0 volts. At a time t1, later than the time t0, the word line may be asserted by applying a high level voltage (e.g., VPP) to the word line, thereby commencing the start of a cell selection and read-out period 405. At a time t2, later than the time t1, the plate line may be pulled to a high level voltage (e.g., VDD), thereby applying a read voltage (e.g., VDD) to a ferroelectric capacitor of the FeRAM cell. Following the time t2, and when the logic value stored by the FeRAM cell is a logic "1," the voltage of the digit line may rise to a voltage greater than a reference voltage (VREF). When the logic value stored by the FeRAM cell is a logic "0," the voltage of the digit line may rise to a voltage less than the reference voltage. The voltage of the digit line when a logic "1" is read is labeled DL_H, and the voltage of the digit line when a logic "0" is read is labeled DL_L.

At a time t3 (e.g., at a time when the voltage of the digit line is expected to be near a steady state, and at the start of a sense amplification period 410), a sense operation (e.g., an amplify and sense operation) may commence. Just prior to the sense operation, the digit line may be decoupled from a first sensing node of a sense component (e.g., from a first sensing node of a sense amplifier). Decoupling the digit line from the first sensing node allows the digit line to remain at a constant voltage level during the sense operation, and prevents "kick back" noise from propagating along the digit line. During the sense operation, the voltage of the first sensing node may be compared to a voltage of a second sensing node, which second sensing node may be biased to the reference voltage prior to commencing the sense operation. When the logic value read from the FeRAM cell is a logic "1" and the voltage of the first sensing node is at a voltage higher than the reference voltage, the voltage of the first sensing node may be amplified to a high supply voltage of the sense component (e.g., VDD) during the sense operation. When the logic value read from the FeRAM cell is a logic "0" and the voltage of the first sensing node is at a voltage lower than the reference voltage, the voltage of the first sensing node may be amplified to a low supply voltage of the sense component (e.g., 0 V) during the sense operation. The voltage of the first sensing node when a logic "1" is read is labeled FSN_H, and the voltage of the first sensing node when a logic "0" is read is labeled FSN_L.

At a time t4, following the sense operation, the voltage of the plate line may be pulled to a low voltage level (e.g., 0 V), and the digit line may be re-coupled to the first sensing node of the sense component. When the charge state of the FeRAM cell has been interfered with because of the read of the FeRAM cell, or when the FeRAM cell is being operated in a DRAM-compatible mode, the voltage of the first sensing node may re-write the logic state of the FeRAM cell (e.g., during a re-writing period 415). Subsequently, at time t5, the word line may be de-asserted, and the voltages of the digit line, the word line, and the plate line may once again be equal.

Figure 5:
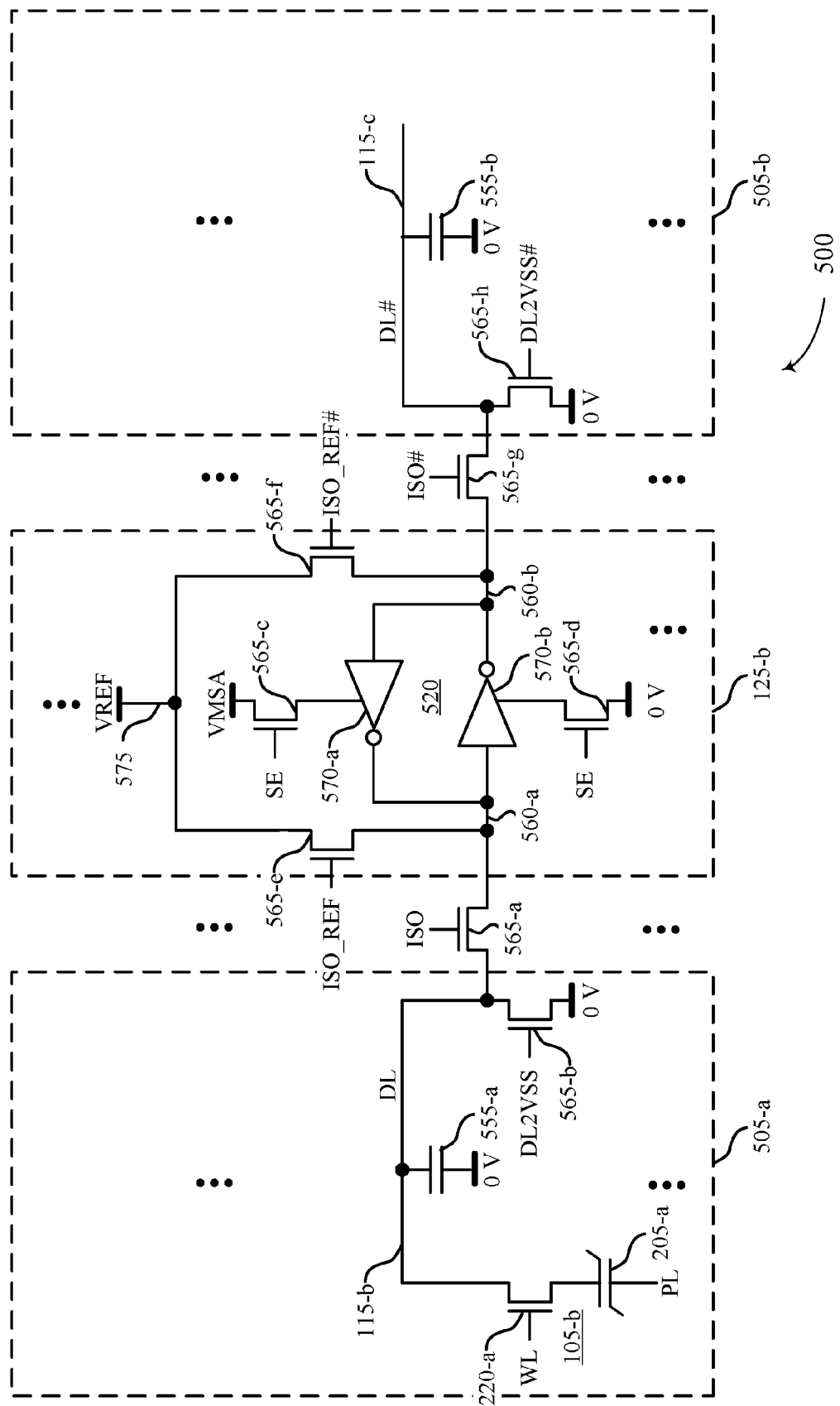
FIG. 5 illustrates an electronic memory apparatus, in accordance with various aspects of the present disclosure.

FIG. 5 illustrates an electronic memory apparatus 500, in accordance with various aspects of the present disclosure. The electronic memory apparatus 500 may include a first memory array 505-a, an optional second memory array 505-b, and a sense component 125-b. The first memory array 505-a may include a first plurality of memory cells, including a first memory cell 105-b. The second memory array 505-b may include a second plurality of memory cells. The sense component 125-b may include a plurality of sense amplifiers, including a first sense amplifier 520. The electronic memory apparatus 500 may be an example of aspects of the electronic memory apparatus 100 described with reference to FIG. 1. The first memory cell 105-b may be an example of aspects of the memory cells 105 described with reference to FIG. 1 or 2.

The first memory cell 105-b (e.g., a first FeRAM cell) may include a selection component 220-a and a ferroelectric capacitor 205-a. The ferroelectric capacitor 205-a may have a cell plate electrode (CP) coupled to a plate line (PL), and a storage node electrode coupled to the selection component 220-a. The selection component 220-a may be coupled between the storage node electrode and a first digit line 115-b. In some examples, the selection component 220-a may include a transistor having a source coupled to the storage node electrode, a drain coupled to the first digit line 115-b, and a gate coupled to a word line (WL).

The first digit line 115-b may be associated with a capacitance 555-a. The first digit line 115-b may be selectively coupled to a first sensing node 560-a of the first sense amplifier 520 by a first transfer gate 565-a. In some examples, the first transfer gate 565-a may include a transistor having a source coupled to the first digit line 115-b, a drain coupled to the first sensing node 560-a, and a gate driven by a first isolation signal (ISO). The first digit line 115-b may also be selectively coupled to a low voltage level source (e.g., 0 V) by a second transfer gate 565-b. In some examples, the second transfer gate 565-b may include a transistor having a source coupled to the low voltage level source (e.g., 0 V), a drain coupled to the first digit line 115-b, and a gate driven by a first pre-charge signal (DL2VSS).

The first sense amplifier 520 may include a first inverter 570-a and a second inverter 570-b, with the first inverter 570-a and the second inverter 570-b being cross-coupled between the first sensing node 560-a and a second sensing node 560-b. Each of the first inverter 570-a and the second inverter 570-b may be coupled by a third transfer gate 565-c to a high voltage power rail (VMSA), and by a fourth transfer gate 565-d to a low voltage power rail (0 V). In some examples, the third transfer gate 565-c may include a transistor having a source coupled to the inverters 570, a drain coupled to the high voltage power rail, and a gate driven by a sense amplifier activation signal (SE). In some examples, the fourth transfer gate 565-d may include a transistor having a source coupled to the low voltage power rail, a drain coupled to the inverters 570, and a gate driven by the sense amplifier activation signal (SE).

A reference node 575 may be coupled to a reference voltage source (VREF). The reference node 575 may be coupled to the first sensing node 560-a by a fifth transfer gate 565-e, and to the second sensing node 560-b by a sixth transfer gate 565-f. The fifth transfer gate 565-e may include a transistor having a source coupled to the first sensing node 560-a, a drain coupled to the reference node 575, and a gate driven by a first biasing signal (ISO_REF). The sixth transfer gate 565-f may include a transistor having a source coupled to the second sensing node 560-b, a drain coupled to the reference node 575, and a gate driven by a second biasing signal (ISO_REF#).

A second digit line 115-c, of the second memory array 505-b, may be associated with a capacitance 555-b. The second digit line 115-c may be selectively coupled to the second sensing node 560-b of the first sense amplifier 520 by a seventh transfer gate 565-g. In some examples, the seventh transfer gate 565-g may include a transistor having a source coupled to the second digit line 115-c, a drain coupled to the second sensing node 560-b, and a gate driven by a second isolation signal (ISO#). The second digit line 115-c may also be selectively coupled to a low voltage level source by an eighth transfer gate 565-h. In some examples, the eighth transfer gate 565-h may include a transistor having a source coupled to the low voltage level source (e.g., a VSS source), a drain coupled to the second digit line 115-c, and a gate driven by a second pre-charge signal (DL2VSS#).

In operation, a controller, which in some cases may be a distributed controller, may operate the first transfer gate 565-a, the second transfer gate 565-b, the third transfer gate 565-c, the fourth transfer gate 565-d, the fifth transfer gate 565-e, the sixth transfer gate 565-f, the seventh transfer gate 565-g, and the eighth transfer gate 565-h. In some examples, the transfer gates 565 may be operated as described with reference to FIG. 6 or 7. In some examples, the controller may receive commands, such as memory read commands or memory load commands, and assert the word line (WL) when the first memory cell 105-b is addressed. The controller may also transition the voltage at the cell plate electrode of the ferroelectric capacitor 205-a from a low voltage level to a high voltage level upon receipt of a read command addressing the first memory cell 105-b. In some examples, the controller may be an example of aspects of the memory controller 140 described with reference to FIG. 1 or 8.

Figure 6:
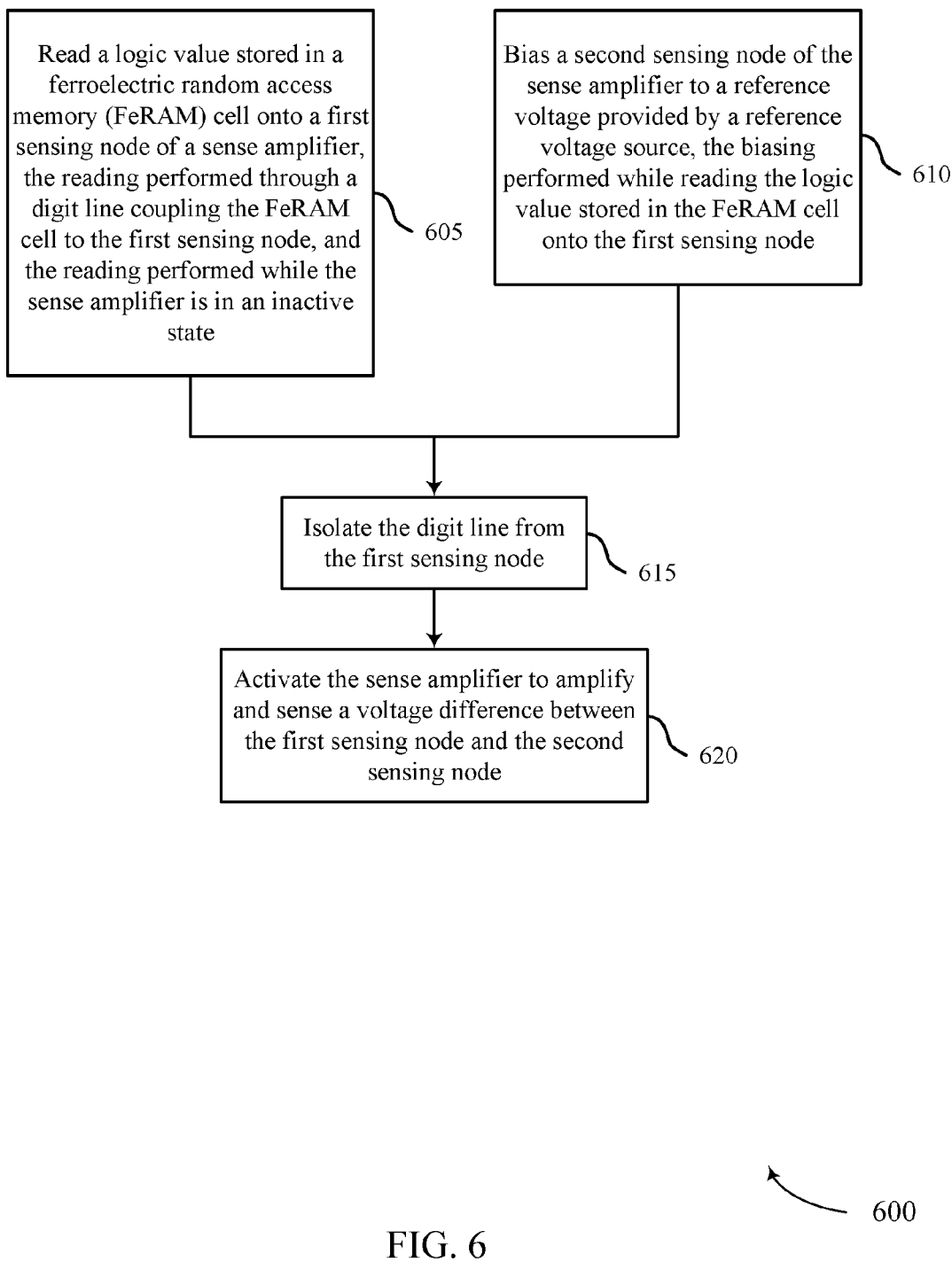
FIG. 6 shows a flowchart illustrating a method of operating an electronic memory apparatus, in accordance with various aspects of the present disclosure.

FIG. 6 shows a flowchart illustrating a method 600 of operating an electronic memory apparatus, in accordance with various aspects of the present disclosure. The operations of the method 600 may be performed on or within an electronic memory apparatus, such as the electronic memory apparatus 100 described with reference to FIG. 1, 2, 5, or 8. In some examples, the operations of the method 600 may be performed by or under the control of a memory controller, such as the memory controller 140 described with reference to FIG. 1 or 8. In some examples, a memory controller may execute a set of codes to control the functional elements of a memory array to perform the functions described below. Additionally or alternatively, the memory controller may perform aspects of the functions described below using special-purpose hardware.

At block 605, the method may include reading a logic value stored in a FeRAM cell onto a first sensing node of a sense amplifier. The reading may be performed through a digit line coupling the FeRAM cell to the first sensing node. The reading may also be performed while the sense amplifier is in an inactive state. In some examples, the FeRAM cell may be an example of aspects of a memory cell described with reference to FIG. 1, 2, 5, or 8, or the sense amplifier may be an example of aspects of the sense component 125 or sense amplifier 520 described with reference to FIG. 1, 2, or 5. In some examples, the operation(s) at block 605 may include closing the first transfer gate 565-*a* described with reference to FIG. 5 and reading the logic value stored in the first memory cell 105-*b*, through the first digit line (DL) 115-*b*, onto the first sensing node 560-*a*. The operation(s) at block 605 may also include asserting the word line (WL) associated with the first memory cell 105-*b*, and transitioning the voltage at the cell plate electrode of the ferroelectric capacitor 205-*a* from a low voltage level to a high voltage level.

At block 610, the method may include biasing a second sensing node of the sense amplifier to a reference voltage provided by a reference voltage source. The biasing may be performed while reading the logic value stored in the FeRAM cell onto the first sensing node. In some examples, the operation(s) at block 610 may include closing the sixth transfer gate 565-*f* described with reference to FIG. 5, to bias the second sensing node 560-*b* to VREF.

At block 615, the method may include isolating the digit line from the first sensing node after the reading. In some examples, the operation(s) at block 615 may include opening the first transfer gate 565-*a* described with reference to FIG. 5, to isolate the digit line (DL) 115-*b* from the first sensing node 560-*a*.

At block 620, the method may include activating the sense amplifier, to amplify and sense a voltage difference between the first sensing node and the second sensing node. The sense amplifier may be activated after isolating the digit line from the first sensing node. In some examples, the operation(s) at block 620 may include closing the third transfer gate 565-*c* and the fourth transfer gate 565-*d* described with reference to FIG. 5.

Figure 7:
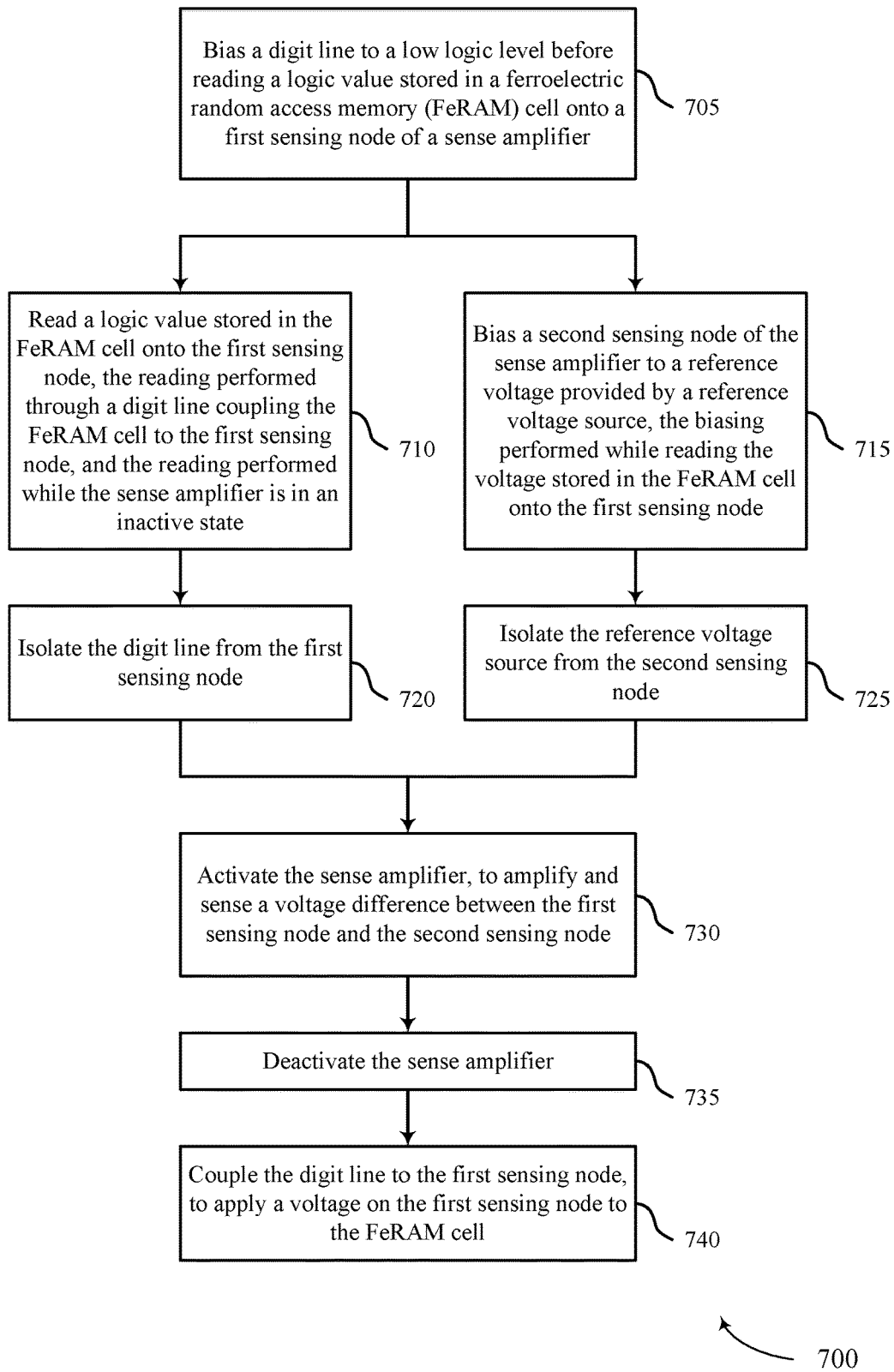
FIG. 7 shows a flowchart illustrating a method of operating an electronic memory apparatus, in accordance with various aspects of the present disclosure.

FIG. 7 shows a flowchart illustrating a method 700 of operating an electronic memory apparatus, in accordance with various aspects of the present disclosure. The operations of the method 700 may be performed on or within an electronic memory apparatus, such as the electronic memory apparatus 100 described with reference to FIG. 1, 2, 5, or 8. In some examples, the operations of the method 700 may be performed by or under the control of a memory controller, such as the memory controller 140 described with reference to FIG. 1 or 8. In some examples, a memory controller may execute a set of codes to control the functional elements of a memory array to perform the functions described below. Additionally or alternatively, the memory controller may perform aspects of the functions described below using special-purpose hardware.

At block 705, the method may include biasing a digit line to a low logic level before reading a logic value stored in a FeRAM cell onto a first sensing node of a sense amplifier. The digit line may selectively couple the FeRAM cell to the first sensing node. In some examples, biasing the digit line to the low level may include closing a transfer gate to couple the digit line to a low voltage level source, and then opening the transfer gate to float the digit line before reading the logic value stored in the FeRAM cell onto the first sensing node. In some examples, the FeRAM cell may be an example of aspects of the memory cell described with reference to FIG. 1, 2, 5, or 8, or the sense amplifier may be an example of aspects of the sense component 125 or sense amplifier 520 described with reference to FIG. 1, 2, or 5. In some examples, the operation(s) at block 705 may include closing, and then opening, the second transfer gate 565-*b* described with reference to FIG. 5. In some examples, the second transfer gate 565-*b* may be closed and then opened while at least the first transfer gate 565-*a*, the third transfer gate 565-*c*, the fourth transfer gate 565-*d*, the fifth transfer gate 565-*e*, the sixth transfer gate 565-*f*, and the seventh transfer gate 565-*g* are open.

At block 710, the method may include reading the logic value stored in the FeRAM cell onto the first sensing node. The reading may be performed through the digit line, which digit line may couple the FeRAM cell to the first sensing node. The reading may also be performed while the sense amplifier is in an inactive state. In some examples, reading the logic value stored in the FeRAM cell may include asserting a word line coupled to a selection component of the FeRAM cell, and transitioning a plate voltage of a ferroelectric capacitor of the FeRAM cell. In some examples, the logic value may be a high logic level (e.g., a logic "1") or a low logic level (e.g., a logic "0"). In some examples, the operation(s) at block 710 may include closing the first transfer gate 565-*a* described with reference to FIG. 5 and reading the logic value stored in the first memory cell 105-*b*, through the first digit line (DL) 115-*b*, onto the first sensing node 560-*a*. The operation(s) at block 710 may also include asserting the word line (WL) associated with the first memory cell 105-*b*, and transitioning the voltage at the cell plate electrode of the ferroelectric capacitor 205-*a* from a low voltage level to a high voltage level.

At block 715, the method may include biasing a second sensing node of the sense amplifier to a reference voltage provided by a reference voltage source. The biasing may be performed while reading the logic value stored in the FeRAM cell onto the first sensing node. In some examples, the operation(s) at block 715 may include closing the sixth transfer gate 565-*f* described with reference to FIG. 5, to couple the reference node 575 to the second sensing node 560-*b*.

At block 720, the method may include isolating the digit line from the first sensing node after the reading. This may float the first sensing node. In some examples, the operation(s) at block 720 may include opening the first transfer gate 565-*a* described with reference to FIG. 5, to isolate the digit line (DL) 115-*b* from the first sensing node 560-*a*.

At block 725, the method may include isolating the reference voltage source from the second sensing node. This may float the second sensing node. In some examples, the reference voltage source may be isolated from the second sensing node after the biasing, and while isolating the digit line from the first sensing node. The operation(s) at block 725 may include opening the sixth transfer gate 565-*f* described with reference to FIG. 5, to isolate the reference node 575 from the second sensing node 560-*b*.

After the performing the operation(s) at block 720 and block 725, the first sensing node and the second sensing node are floating. If the characteristics of the first transfer gate and the second transfer gate are matched, and if the first transfer gate and the second transfer gate are evenly laid out with respect to the sense amplifier and the first and second sensing nodes, the capacitive coupling on the first sensing node may be the same as the capacitive coupling on the second sensing node.

At block 730, the method may include activating the sense amplifier, to amplify and sense a voltage difference between the first sensing node and the second sensing node. The sense amplifier may be activated after isolating the digit line from the first sensing node, and after isolating the reference voltage source from the second sensing node. As the voltage difference between the first sensing node and the second sensing node is amplified and sensed, the voltage difference may be latched by the sense amplifier. In some examples, the operation(s) at block 730 may include closing the third transfer gate 565-c and the fourth transfer gate 565-d described with reference to FIG. 5.

At block 735, the method may include deactivating the sense amplifier. The sense amplifier may be deactivated after sensing (and latching) the voltage difference between the first sensing node and the second sensing node. The operation(s) at block 735 may include opening the third transfer gate 565-c and the fourth transfer gate 565-d described with reference to FIG. 5.

At block 740, the method may include coupling the digit line to the first sensing node, to apply a voltage on the first sensing node to the FeRAM cell. The digit line may be coupled to the first sensing node after deactivating the sense amplifier at block 735. Applying the voltage on the first sensing node to the FeRAM cell writes the logic value read from the FeRAM cell back to the FeRAM cell. The operation(s) at block 740 may include closing the first transfer gate 565-a described with reference to FIG. 5.

In some examples of the method 700, the digit line may include a first digit line, and the method may include isolating a second digit line from the second sensing node during the reading (at block 710), the biasing (at block 715), the isolating (at block 720 and block 725), the activating (at block 730), the deactivating (at block 735), and the coupling (at block 740).

Figure 8:
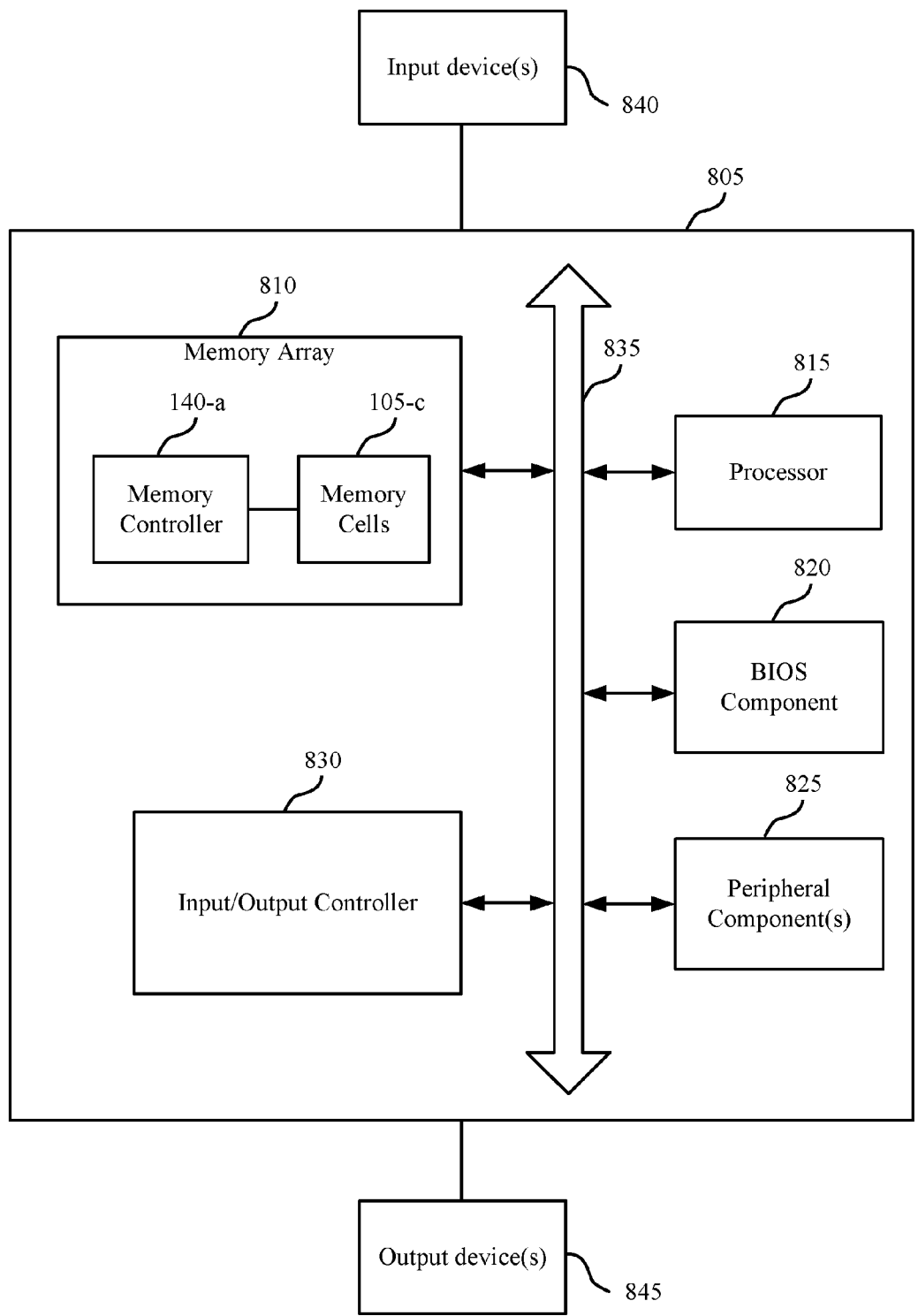
FIG. 8 shows a diagram of a system that selectively decouples digit lines from sense components and floats the sensing nodes of sense components during memory sense operations, in accordance with various aspects of the present disclosure.

FIG. 8 shows a diagram of a system 800 that selectively decouples digit lines from sense components and floats the sensing nodes of sense components during memory sense operations, in accordance with various aspects of the present disclosure. The system 800 may include a device 805, which may be or include a printed circuit board to connect or physically support various components of the system 800. The device 805 may include an electronic memory apparatus 810 (or memory array), which may be an example of the electronic memory apparatus 100, 200 or 500 described with reference to FIG. 1, 2, or 5. The electronic memory apparatus 810 may include a memory controller 140-a and memory cells 105-c, which may be examples of the memory controller 140 described with reference to FIG. 1 and the memory cells 105 described with reference to FIG. 1, 2, or 5. The device 805 may also include a processor 815, a BIOS component 820, a peripheral component (or peripheral components) 825, and an input/output controller 830. The components of the device 805 may be in electronic communication with one another through a bus 835.

The processor 815 may be configured to operate the electronic memory apparatus 810 through the memory controller 140-a. In some cases, the memory controller 140-a may perform the functions of the memory controller 140 described with reference to FIG. 1. In other cases, some or all of the functions of the memory controller 140-a may be integrated into the processor 815. The processor 815 may include a general-purpose processor, a digital signal processor (DSP), an application-specific integrated circuit (ASIC), a field-programmable gate array (FPGA) or other programmable logic device, a discrete gate or transistor logic device, a set of discrete hardware components, or a combination of these types of components. The processor 815 may perform various functions described herein. The processor 815 may, for example, be configured to execute computer-readable instructions stored in the electronic memory apparatus 810 to cause the device 805 to perform various functions or tasks.

The BIOS component 820 may be a software component that includes a basic input/output system (BIOS) operated as firmware, which may initialize and run various hardware components of the system 800. The BIOS component 820 may also manage data flow between the processor 815 and various other components, e.g., the peripheral component(s) 825, the input/output controller 830, etc. The BIOS component 820 may include a program or software stored in read-only memory (ROM), flash memory, or any other non-volatile memory.

The peripheral component(s) 825 may be any input or output device, or an interface for such devices, that is integrated into the device 805. Examples may include disk controllers, sound controllers, graphics controllers, Ethernet controllers, modems, USB controllers, serial or parallel ports, or peripheral card slots such as peripheral component interconnect (PCI) or accelerated graphics port (AGP) slots.

The input/output controller 830 may manage data communication between the processor 810 and the peripheral component(s) 820, input device(s) 840, or output device(s) 845. The input/output controller 830 may also manage peripherals that are not integrated into the device 805. In some cases, the input/output controller 830 may represent a physical connection or port to the external peripheral.

the input device(s) 840 may represent a device or signal external to the device 805 that provides input to the device 805 or any of its components. This may include a user interface, or an interface with or between other devices. In some cases, the input device(s) 840 may include a peripheral that interfaces with the device 805 via the peripheral component(s) 825, or a peripheral that is managed by the input/output controller 830.

The output device(s) 845 may represent a device or signal external to device 805 configured to receive output from the device 805 or any of its components. Examples of the output device(s) 845 may include a display, audio speakers, a printing device, another processor or printed circuit board, etc. In some cases, the output device(s) 845 may include a peripheral that interfaces with the device 805 via the peripheral component(s) 825, or a peripheral that is managed by the input/output controller 830.

The components of the system 800, the device 805, or the electronic memory apparatus 810 may include circuitry designed to carry out their functions. This may include various circuit elements, for example, conductive lines, transistors, capacitors, inductors, resistors, amplifiers, or other active or inactive elements, configured to carry out the functions described herein.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including the electronic memory apparatus 100, 200, or 500, or the device 805, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating a memory apparatus, comprising:
    isolating a digit line from a first sensing node of a sense amplifier before sensing a voltage difference between the first sensing node and a second sensing node; and
    activating the sense amplifier to amplify and sense a voltage difference between the first sensing node and the second sensing node based at least in part on the isolating.

2. The method of claim 1, further comprising:
    deactivating the sense amplifier based at least in part on sensing the voltage difference between the first sensing node and the second sensing node.

3. The method of claim 2, further comprising:
    applying a voltage on the first sensing node by coupling the digit line to the first sensing node after deactivating the sense amplifier.

4. The method of claim 1, further comprising:
    reading a logic value stored in a memory cell onto the first sensing node based at least in part on coupling the memory cell to the first sensing node.

5. The method of claim 4, further comprising:
    determining a state of the sense amplifier prior to the isolating, wherein reading the logic value is further based at least in part on determining the state of the sense amplifier.

6. The method of claim 4, further comprising:
    biasing the second sensing node of the sense amplifier to a reference voltage from a reference voltage source, wherein reading the logic value is further based at least in part on the biasing.

7. The method of claim 6, further comprising:
    isolating the reference voltage source from the second sensing node of the sense amplifier after biasing the second sensing node and before sensing a voltage difference between the first sensing node and the second sensing node.

8. A method for a read operation by a memory apparatus, comprising:
    initiating a sense operation;
    coupling a digit line to a first sensing node of a sense amplifier based at least in part on the initiating;
    reading a logic value stored in a memory cell onto the first sensing node of the sense amplifier based at least in part on the coupling; and
    isolating the digit line from the first sensing node after the reading and before sensing a voltage difference between the first sensing node and a second sensing node.

9. The method of claim 8, further comprising:
    biasing the second sensing node of the sense amplifier to a reference voltage provided by a reference voltage source, wherein the biasing is performed while reading the logic value.

10. The method of claim 8, wherein a first voltage of the digit line, a word line, and a plate line associated with the memory apparatus are equal during a first period, wherein the first period occurs prior to the sense operation.

11. The method of claim 10, further comprising:
    applying, to the word line, a second voltage that is greater than the first voltage; and
    performing a cell selection and the read operation during a second period based at least in part on the applying.

12. The method of claim 11, wherein the second period is after the first period.

13. The method of claim 11, further comprising:
    applying, to the plate line, a third voltage during the second period, wherein the third voltage is less than the second voltage; and
    applying, to a capacitor of the memory cell, the third voltage.

14. The method of claim 8, further comprising:
    determining that a voltage of the digit line is greater than or less than a reference voltage from a reference voltage source based at least in part on the logic value stored in the memory cell; and
    determining that the voltage of the digit line is in a steady state, wherein initiating the sense operation is based at least in part on the voltage of the digit line being in the steady state.

15. The method of claim 8, further comprising:
    determining that a voltage applied to the first sensing node is greater than a reference voltage provided by a reference voltage source; and
    amplifying the voltage of the first sensing node during the sense operation based at least in part on the logic value stored in the memory cell and determining that the voltage applied to the first sensing node is greater than the reference voltage.

16. The method of claim 8, further comprising:
    recoupling the digit line to the first sensing node after the sense operation.

17. A memory apparatus, comprising:
    a sense amplifier having a first sensing node and a second sensing node; and
    a controller operable to: isolate a digit line from the first sensing node of the sense amplifier before sensing a voltage difference between the first sensing node and the second sensing node; and activate the sense amplifier to amplify and sense a voltage difference between the first sensing node and the second sensing node based at least in part on the isolating.

18. The memory apparatus of claim 17, wherein the controller is operable to:
close a first transfer gate of the plurality of transfer gates to read a logic value stored in a memory cell onto the first sensing node through the digit line;
close a second transfer gate of the plurality of transfer gates to bias the second sensing node to a reference voltage provided by a reference voltage source; and
open the first transfer gate to isolate the digit line from the first sensing node based at least in part on closing the first transfer gate.

19. The memory apparatus of claim 18, wherein the controller is operable to:
deactivate the sense amplifier based at least in part on sensing the voltage difference between the first sensing node and the second sensing node.

20. The memory apparatus of claim 19, wherein the controller is operable to:
close the first transfer gate to couple the digit line to the first sensing node to apply a voltage on the first sensing node based at least in part on the deactivation.

* * * * *